(12) United States Patent
Oyu et al.

(10) Patent No.: US 7,129,141 B2
(45) Date of Patent: Oct. 31, 2006

(54) METHOD FOR MANUFACTURING A SEMICONDUCTOR DEVICE HAVING A LOW JUNCTION LEAKAGE CURRENT

(75) Inventors: Kiyonori Oyu, Tokyo (JP); Kensuke Okonogi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/024,623

(22) Filed: Dec. 30, 2004

(65) Prior Publication Data

US 2005/0153528 A1    Jul. 14, 2005

(30) Foreign Application Priority Data

Jan. 9, 2004    (JP)    .............................. 2004-003633

(51) Int. Cl.
*H01L 21/336*    (2006.01)
*H01L 21/425*    (2006.01)

(52) U.S. Cl. ...................... 438/301; 438/308; 438/514; 438/519; 438/522

(58) Field of Classification Search ................ 438/301, 438/308, 514, 519, 522, 527
See application file for complete search history.

(56) References Cited

U.S. PATENT DOCUMENTS 5,654,209 A * 8/1997 Kato ........................... 438/528

6,091,113 A * 7/2000 Tanaka ........................ 257/355
6,709,906 B1 * 3/2004 Yamaguchi et al. ......... 438/162

FOREIGN PATENT DOCUMENTS

| JP | 64-32640 | 2/1989 |
|----|----------|--------|
| JP | 3212150 | 7/2001 |
| KR | 1996-11638 | 8/1996 |
| KR | 2002-25830 | 4/2002 |

OTHER PUBLICATIONS

T. Umeda, et al., "Defects related to DRAM leakage current studied by electrically detected magnetic resonance", vol. 308-310, pp. 1169-1172, 2001.

Korean Office Action dated Jun. 9, 2006 with a partial English translation.

* cited by examiner

*Primary Examiner*—Hsien-Ming Lee
(74) *Attorney, Agent, or Firm*—McGinn IP Law Group, PLLC

(57) ABSTRACT

A method for manufacturing a DRAM device includes the step of implanting phosphor at a specified dosage and heat treating the implanted phosphor for diffusion thereof to form source/drain regions, and implanting fluorine into the source/drain regions and heat treating the implanted fluorine for diffusion thereof. The resultant DRAM memory cell has a larger data storage capability due to lower junction leakage current caused by vacancy type defects formed in the metallurgical junction between the source/drain regions and the channel region.

19 Claims, 6 Drawing Sheets

(a)···DATA STORAGE TIME
(b)···HOT-CARRIER TOLERANCE
(c)···FALL OF THRESHOLD VOLTAGE
(d)···RISE OF SHEET RESISTANCE
(e)···DATA STORAGE TIME (a)···DATA STORAGE TIME
(b)···HOT-CARRIER TOLERANCE
(c)···FALL OF THRESHOLD VOLTAGE
(d)···RISE OF SHEET RESISTANCE
(e)···DATA STORAGE TIME

METHOD FOR MANUFACTURING A SEMICONDUCTOR DEVICE HAVING A LOW JUNCTION LEAKAGE CURRENT

BACKGROUND OF THE INVENTION (a) Field of the Invention

The present invention relates to a method for manufacturing a semiconductor device having a low junction leakage current and, more particularly, to a method suited to manufacturing memory devices such as DRAM and SRAM.

(b) Description of the Related Art

Portable data processing devices such as cellular phone and personal digital assistant are increasingly used in these days. In general, a memory cell in a memory device such as DRAM and SRAM used in the portable data processing devices should have a MOS transistor or MOS transistors having lower junction leakage current. With reference to FIGS. 1A to 1G, a conventional method for manufacturing a DRAM device will be described hereinafter.

A 250-nm-deep trench is formed on a surface region of a silicon substrate 1, followed by depositing a silicon oxide film 2 within the trench to form a shallow trench isolation (STI) structure. Subsequently, a 10-nm-thick silicon oxide film 3 is formed on the silicon substrate 1, as shown in FIG. 1A, followed by implantation of boron ions through the silicon oxide film 3 for three times. The three-time implantation of boron ions is conducted at an acceleration energy of 250 keV and a dosage of $1\times10^{13}/cm^2$, at an acceleration energy of 150 keV and a dosage of $5\times10^{12}$ cm/$^2$, and at an acceleration energy of 80 keV and a dosage of $3\times10^{12}/cm^2$. Thereafter, a heat treatment is performed at a substrate temperature of 1000 degrees C. for 30 minutes to restore the silicon substrate from the damages caused by boron implantation, thereby forming p-wells 4 on the silicon substrate 1.

Subsequently, further implantation of boron ions through the thin silicon oxide film 3 is performed at an acceleration energy of 15 keV and a dosage of $1\times10^{13}/cm^2$, thereby forming p-type channel regions 6, as shown in FIG. 1B. After removing the thin silicon oxide film 3, a 6-nm-thick gate insulation film 7 made of silicon oxide is formed using a thermal oxidation technique. The threshold voltage of a cell transistor is generally designed by determining the impurity concentration profile of the p-type channel region 6 and the thickness of the gate insulation film 7.

Thereafter, on the gate insulation film 7 are consecutively formed a 100-nm-thick polysilicon film 9a doped with phosphorous at a concentration of $4\times10^{20}/cm^3$, a 70-nm-thick tungsten silicide film 9b, and a 130-nm-thick insulation film 8 including a silicon nitride layer and a silicon oxide layer. Subsequently, the insulation film 8, tungsten silicide film 9b and polysilicon film 9a are patterned to configure 2-layer gate electrodes 9 and overlying insulation films 8. Side-wall oxide films 10 are then formed on the side walls of the gate electrodes 9 by using a thermal oxidation technique. This thermal oxidation also oxidizes surface portions of the silicon substrate 1 exposed by the patterning process.

Thereafter, implantation of phosphorous ions is performed twice through the gate insulation film 7 by a self-aligned process using the gate electrodes 9 as a mask at an acceleration energy of 20 keV and a dosage of $7\times10^{12}/cm^2$, and at an acceleration energy of 15 keV and a dosage of $7\times10^{12}/cm^2$. Another heat treatment is then performed at a substrate temperature of 1000 degrees C. for 10 seconds to activate the implanted phosphorous ions for obtaining source/drain diffused regions 11 as well as to activate dopants in the diffused regions formed in the peripheral area of the memory device, as shown in FIG. 1D.

A silicon nitride film is then deposited and subjected to an etch-back process, thereby forming a 40-nm-thick silicon-nitride side spacers 12, as shown in FIG. 1E. Implantation of phosphorous ions through the gate insulation film 7 and the source/drain diffused regions 11 is then performed by a self-aligned technique using the insulation films 8 and the side spacers 12 on the gate electrodes 9, thereby forming electric-field alleviating regions 13 on the bottoms of the source/drain diffused regions 11.

Subsequently, as shown in FIG. 1F, a silicon oxide film and a silicon nitride film are consecutively deposited on the entire surface, thereby forming a 350-nm-thick interlayer dielectric film 14. The interlayer dielectric film 14 is then etched-back using an anisotropic etching technique for planarization thereof. A patterning process is then performed to the interlayer dielectric film 14, insulation films 8, side spacers 12 and gate insulation film 7 to form through-holes 15a for exposing therethrough surface portions of the source/drain diffused regions 11. Implantation of phosphorous ions is again performed by a self-aligned technique using the interlayer dielectric film 14, insulation films 8 and side spacers 12 as a mask, toward the bottom of the electric-field alleviating regions 13 through the source/drain diffused regions 11. A polysilicon film doped with phosphorous ions at a concentration of $2\times10^{20}/cm^3$ is then deposited on the interlayer dielectric film 14 and in the through-holes 15a, and etched-back to configure 350-nm-long contact plugs 15.

Subsequently, a 50-nm-thick interlayer dielectric film 19 made of silicon oxide is deposited and patterned to form through-holes 17a therein. A 100-nm-thick tungsten film is then deposited on the interlayer dielectric film 19 and in the through-holes 17a, and patterned to configure bit lines 17. Thereafter, an interlayer dielectric film 20 is deposited, followed by patterning the interlayer dielectric films 19 and 20 to form through-holes 21a therein and filling the through-holes 21a with contact plugs 21. Cell capacitors 18 each having a cylindrical structure and including a bottom electrode 22, an insulation film 23 and a top electrode 24 are then formed, the bottom electrode 22 being in contact with the underlying contact plug 21, as shown in FIG. 1G.

The memory cells should be downsized along with the development of the higher-density DRAMs. For meeting this downsizing of the memory cell, the gate length of the MOS transistor must be reduced while maintaining the previous threshold voltage of the MOS transistor. This is generally achieved by increasing the dopant concentration of the channel region 6 of the MOS transistor. In this structure, however, there arises a problem that the electric field across the junction between the channel region 6 and the source/drain diffused regions 11 is intensified to thereby increase the junction leakage current. The increase of the junction leakage current degrades the charge storage capability, or data storage capability, of the memory cell. For reducing the junction leakage current, two technologies are considered: one for alleviating the electric field intensity across the p-n junction; and the other for reducing the number of vacancy type defects or vacancy type defects which are the origin of the junction leakage current.

The technology for alleviating the electric field intensity is generally employed in the conventional technique for preventing the decrease of charge storage capability of the memory cell, and a variety of proposals therefor have been presented. Patent Publication JP-3212150, for example, discloses a technique wherein the profile of the dopant concentrations (or carrier density) in the p- and n-type regions adjacent to the p-n junction are controlled so that the electric field across the p-n junction does not exceed 1 MV/cm, at which the local Zener effect markedly arises in general. However, the technology for alleviating the electric field across the junction, such as proposed in the publication, only achieves a limited effect for the far-downsized memory devices. Thus, the other technology for reducing the number of vacancy type defects now attracts more attentions in the memory device industry.

The vacancy type defects are generally formed in the two-step procedure. First, the step of implanting dopants in the silicon substrate for forming therein the source/drain diffused regions generates implantation damages in the source/drain diffused regions. Although most of the implantation damages are restored by the subsequent heat treatment, some are transformed into vacancy type defects during this heat treatment. The vacancy type defects remain in the vicinities of the metallurgical junctions 25 formed between the source/drain diffused regions 11 and the doped channel region 6, as shown by "x" marks in FIG. 6, due to the influence by the compressive strain generated during the heat treatment. This phenomenon was assured by an experiment using an electrically detected magnetic resonance, as described in a publication "Defects related to DRAM leakage current studied by electrically detected magnetic resonance", by T. Umeda et al., vol. 308 –310, pp1169 –1172 (2001).

It is known that the vacancy type defect includes divacancy plus one or two oxygen atoms within a lattice structure of the silicon substrate, as shown in FIG. 7. The vacancy type defect is also associated with neighboring dangling bonds 26, which are uncoupled bonds of the silicon atoms. The vacancy type defects remaining in the vicinity of the metallurgical junction 25 are raised to an energy level within the energy bandgap by the presence of the dangling bonds, thereby generating junction leakage current due to this energy level. The junction leakage current reduces the charge storage capability of the memory cell, as described above.

Patent Publication JP-A-1(1989)-32640 describes a technique for reducing the leakage current which may otherwise increase in the vicinity of the dopant diffused region along with a smaller depth thereof. In this publication, by using implantation of fluorine together with a heat treatment, the traps are reduced by the fluorine in the vicinity of the diffused region, to thereby reduce the leakage current in the vicinity of the diffused region.

JP-A-1-32640 is silent to the vacancy type defect remaining in the vicinity of the metallurgical junction formed between the source/drain diffused regions and the doped channel region. In addition, the technique described in this publication does not achieve the suppression of the junction leakage current caused by the vacancy type defect.

SUMMARY OF THE INVENTION

In view of the above problem in the conventional technique, it is an object of the present invention to provide a method for forming a semiconductor device having a lower junction leakage current in a MOS transistor, and thus capable of improving a charge storage capability of a memory cell in a DRAM device if applied to fabrication of the DRAM device.

The present invention provides a method for manufacturing a semiconductor device including the steps of: implanting phosphor into a semiconductor substrate at a specified dosage, and heat treating the implanted phosphor for diffusion thereof to form source/drain regions; and implanting halogen into the source/drain regions at a dosage of not higher than the specified dosage, and heat treating the implanted halogen for diffusion thereof.

In accordance with the method of the present invention, the implanted halogen terminates the dangling bonds in the vacancy type defects, thereby extinguishing the origin of the junction leakage current. The extinction of the origin of the junction leakage current reduces the junction leakage current in the MOSFET, to improve the charge storage capability or data storage capability of the memory cell if used in a DRAM device.

The above and other objects, features and advantages of the present invention will be more apparent from the following description, referring to the accompanying drawings.

PREFERRED EMBODIMENT OF THE INVENTION

The inventors conducted first and second experiments as detailed hereinafter prior to the present invention. The first experiment was such that steps of implanting fluorine ions to the source/drain regions 11 (FIG. 1D) and a subsequent heat treatment were added to the conventional fabrication process to manufacture DRAM cells. The dosage of the fluorine was changed from 0 to $5\times10^{13}/cm^2$ in the implantation, and the resultant DRAM cells were measured in the characteristics thereof including hot-carrier tolerance, fall in the threshold voltage, sheet resistance of the source/drain diffused regions. The heat treatment was conducted for 10 seconds at a substrate temperature of 1000 degrees C. for diffusing the implanted fluorine ions.

The second experiment was such that, prior to the implantation of fluorine atoms using conditions similar to the conditions used in the first experiment, the source/drain diffused regions were formed by twice implantation of phosphorous ions at an acceleration energy of 20 keV and a dosage of $1.5\times10^{13}/cm^2$ and at an acceleration energy of 15 keV and a dosage of $1.5\times10^{13}/cm^2$, to thereby obtain a total dosage of $3\times10^{13}/cm^2$. The resultant DRAM cells were subjected to measurements of characteristics thereof similarly to the first experiment.

Figure 2:
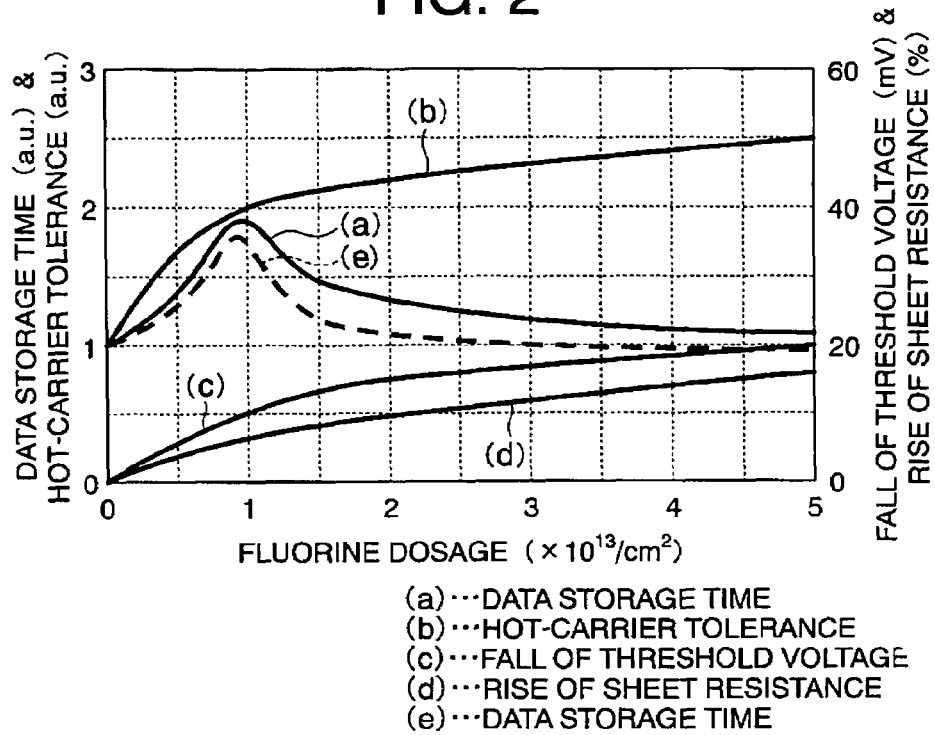
FIG. 2 is a graph showing the relationship between characteristics and the fluorine dosage in DRAM devices manufactured by the fabrication process of a first embodiment of the present invention.
Figure 3:
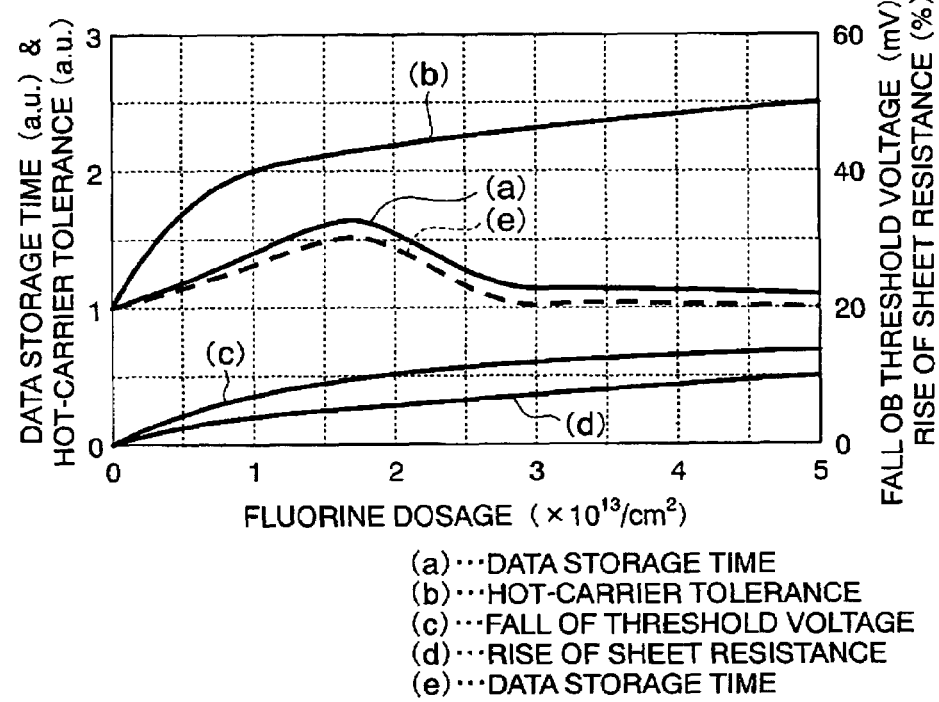
FIG. 3 is a graph showing the relationship between characteristics and the fluorine dosage in DRAM devices manufactured by the fabrication process of a second embodiment of the present invention.

FIGS. 2 and 3 show results of the first and second experiments, respectively. In these graphs, curves (a) to (d) show normalized charge storage time, normalized hot-carrier tolerance, fall in the threshold voltage, and rise in the sheet resistance of the source/drain regions 11, respectively. In addition, dotted curve (e) shows normalized data storage time in the case of a boron dosage of $1.5\times1013/cm2$ for forming the p-type channel region 6.

As understood from FIGS. 2 and 3, those characteristics are changed by changing the fluorine dosage. For example, in FIG. 2, those characteristics are improved along with the increase of fluorine dosage from 0 to around $5\times10^{13}/cm_2$, and the degree of the improvement thereof is reduced for the fluorine dosage exceeding this range. Similarly, those characteristics are improved along with the increase of fluorine dosage from 0 to around $2\times10^{13}/cm^2$, and the degree of the improvement is reduced for the fluorine dosage exceeding this range.

The hot-carrier tolerance is improved along with the increase of fluorine dosage in FIGS. 2 and 3, and saturates at around the fluorine dosage equal to the total phosphorous dosage.

As understood from FIGS. 2 and 3, a higher fluorine dosage reduces the threshold voltage. Besides, the sheet resistance of the source/drain diffused regions 11 increases along with the increase of the fluorine dosage. The fall in the threshold voltage is undesirable because the channel leakage current will increase thereby. The increase of the sheet resistance should be suppressed within 10% for suppressing the decrease of the ON current.

It was found from the results of the above experiments that a desirable range of the fluorine dosage, which suppresses the fall of the threshold voltage and the rise of sheet resistance of the source/drain regions caused by the adverse affects of the fluorine implantation and yet improves the data storage time and the hot-carrier tolerance, is substantially equal to or below the total dosage of phosphorous ions implanted for forming the source/drain regions. It is to be noted that a higher boron dosage of $1.5\times10^{13}/cm^2$ for the p-type channel region, if employed instead of the boron dosage of $1\times10^{13}/cm^2$, significantly reduces the degree of improvement in the data storage time, although it compensates the fall of the threshold voltage. Thus, a higher boron dosage for the channel region is undesirable. For compensating the fall of threshold voltage, it is advantageous to reduce the phosphorous dosage. The coupling between the fluorine and silicon is stable during the heat treatment conducted in a hydrogen ambient at the last stage of fabrication of the semiconductor device, because the coupling energy therebetween is markedly large.

The inventors then performed a third experiment for forming vacancy type defects and terminating the dangling bonds of silicon at a single step after the phosphor implantation for forming the source/drain regions. This might be achieved by a fluorine implantation process following the phosphor implantation without performing a heat treatment for activation of implanted phosphorous ions. The third experiment achieved, however, little improvement in the data storage time and the hot-carrier tolerance. This was considered due to the fact that most of the fluorine ions had been scattered and lost to the other substrate area before the vacancy type defects were actually formed by the phosphor implantation. The results of the experiment revealed that the fluorine implantation and the subsequent heat treatment should be performed after the vacancy type defects are formed by the heat treatment for diffusing the implanted phosphorous ions. More specifically, the step of forming the vacancy type defects and the step of terminating the dangling bonds with fluorine ions should be separated.

Now, the present invention is more specifically described with reference to accompanying drawings, wherein similar constituent elements are designated by similar reference numerals throughout the drawings.

A process forming a semiconductor (DRAM) device according to an embodiment of the present invention includes the steps of implanting fluorine ions and diffusing the implanted fluorine ions in addition to the conventional process as described with reference to FIGS. 1A to 1G.

Figure 1A:
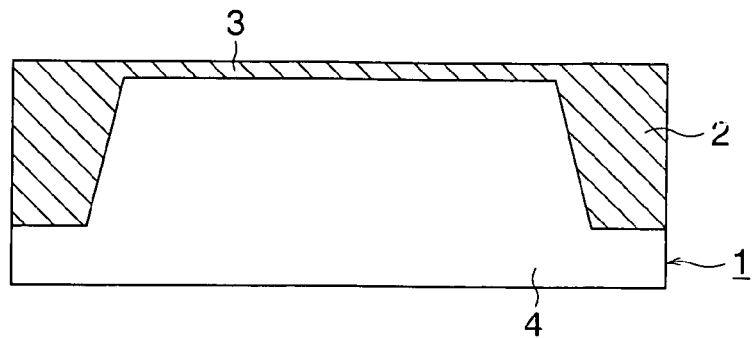
FIG. 1A to 1G are sectional views of a semiconductor device in consecutive steps of a fabrication process according to an embodiment of the present invention and of a conventional fabrication process.

More specifically, a 250-nm-deep trench is formed on a surface region of a silicon substrate 1, followed by depositing a silicon oxide film 2 within the trench to form a shallow trench isolation (STI) structure. Subsequently, a 10-nm-thick silicon oxide film 3 is formed on the silicon substrate 1, as shown in FIG. 1A, followed by implantation of boron ions through the silicon oxide film 3 for three times. The three-time implantation of boron ions is conducted at an acceleration energy of 250 keV and a dosage of $1\times10^{13}/cm^2$ at an acceleration energy of 150 keV and a dosage of $5\times10^{12}$ $cm/^2$, and at an acceleration energy of 80 keV and a dosage of $3\times10^{12}/cm^2$. Thereafter, a heat treatment is performed at a substrate temperature of 1000 degrees C. for 30 minutes to restore the silicon substrate from the damages caused by boron implantation, thereby forming p-wells 4 on the silicon substrate 1.

Figure 1B:
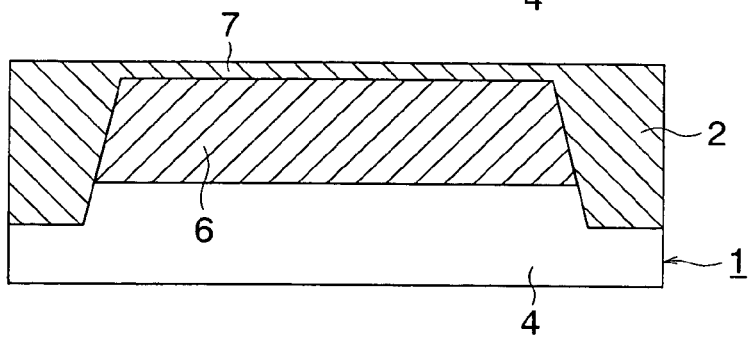
Figure 1C:
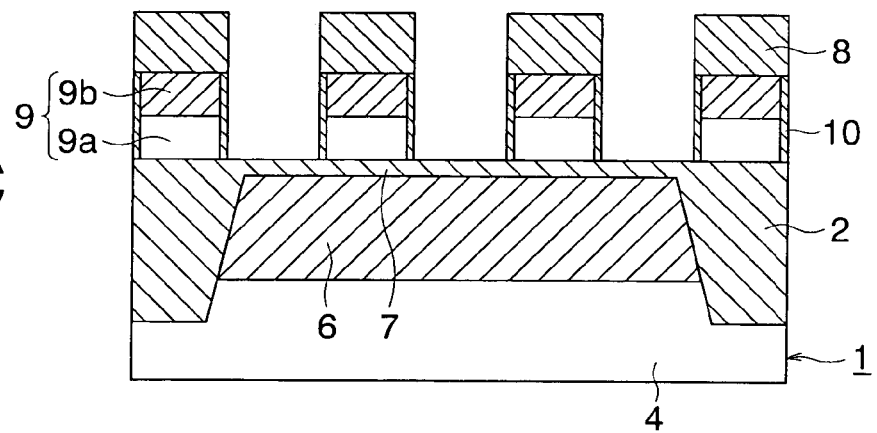

Subsequently, further implantation of boron ions through the thin silicon oxide film 3 is performed at an acceleration energy of 15 keV and a dosage of $1\times10^{13}/cm^2$, thereby forming p-type channel regions 6, as shown in FIG. 1B. After removing the thin silicon oxide film 3, a 6-nm-thick gate insulation film 7 made of silicon oxide is formed using a thermal oxidation technique. The threshold voltage of a cell transistor is generally designed by determining the impurity concentration profile of the p-type channel region 6 and the thickness of the gate insulation film 7.

Thereafter, on the gate insulation film 7 are consecutively formed a 100-nm-thick polysilicon film 9a doped with phosphorous at a concentration of $4\times10^{20}/cm^3$, a 70-nm-thick tungsten silicide film 9b, and a 130-nm-thick insulation film 8 including a silicon nitride layer and a silicon oxide layer. Subsequently, the insulation film 8, tungsten silicide film 9b and polysilicon film 9a are patterned to configure 2-layer gate electrodes 9 and overlying insulation films 8. Side-wall oxide films 10 are then formed on the side walls of the gate electrodes 9 by using a thermal oxidation technique. This thermal oxidation also oxidizes surface portions of the silicon substrate 1 exposed by the patterning process.

Figure 1D:
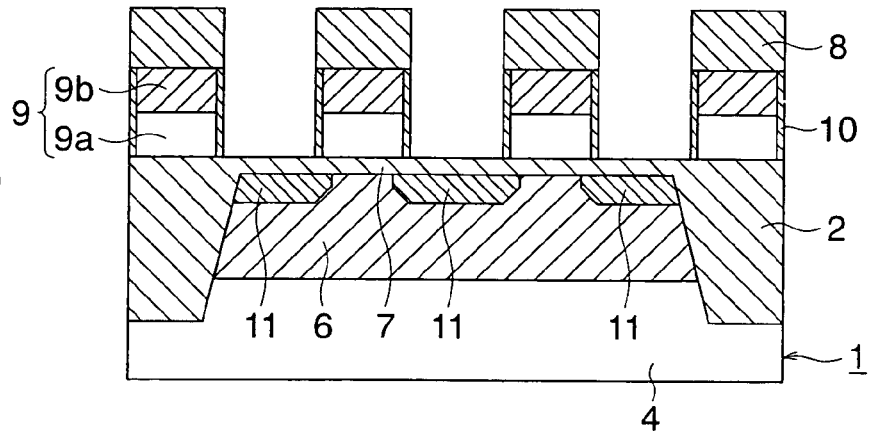

Thereafter, implantation of phosphorous ions is performed twice through the gate insulation film 7 by a self-aligned process using the gate electrodes 9 as a mask at an acceleration energy of 20 keV and a dosage of $7\times10^{12}/cm^2$, and at an acceleration energy of 15 keV and a dosage of $7\times10^{12}/cm^2$. Another heat treatment is then performed at a substrate temperature of 1000 degrees C. for 10 seconds to activate the implanted phosphorous ions for obtaining source/drain diffused regions 11 as well as to activate dopants in the diffused regions formed in the peripheral area of the memory device, as shown in FIG. 1D.

Subsequently, implantation of fluorine is performed using the insulation film 8 as a mask through the gate insulation film 7 to the source/drain regions 11 at an acceleration energy of 10 keV and a dosage of $7\times10^{12}/cm^2$. This acceleration energy allows the fluorine to reach half the depth of the source/drain regions 11. Thereafter, a heat treatment for diffusing dopants implanted in the source/drain regions of the peripheral area of the DRAM device is performed for 10 seconds at a substrate temperature of 1000 degrees C., whereby the fluorine implanted in the source/drain regions 11 are diffused by this heat treatment.

Figure 1E:
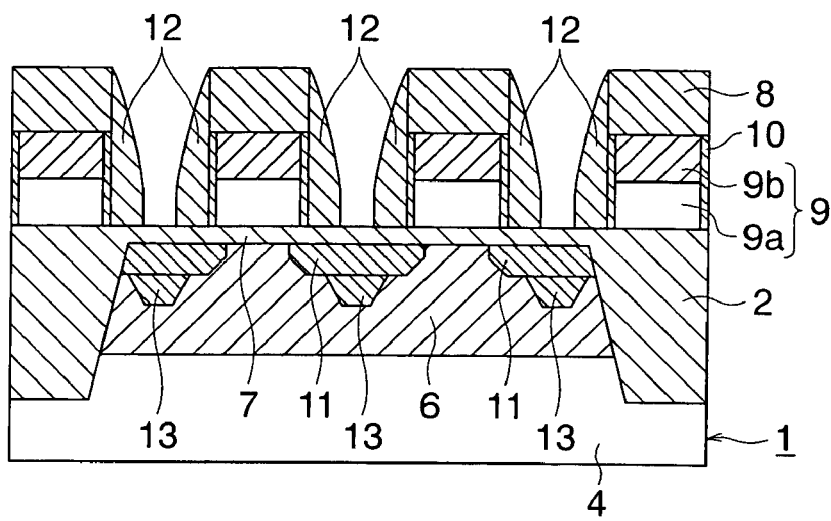

A silicon nitride film is then deposited and subjected to an anisotropic etch-back process, thereby forming a 40-nm-thick silicon-nitride side spacers 12, as shown in FIG. 1E. Implantation of phosphorous ions through the gate insulation film 7 and the source/drain diffused regions 11 is then performed by a self-aligned technique using the insulation films 8 and the side spacers 12 on the gate electrodes 9, thereby forming electric-field alleviating regions 13 on the bottoms of the source/drain diffused regions 11.

Figure 1F:
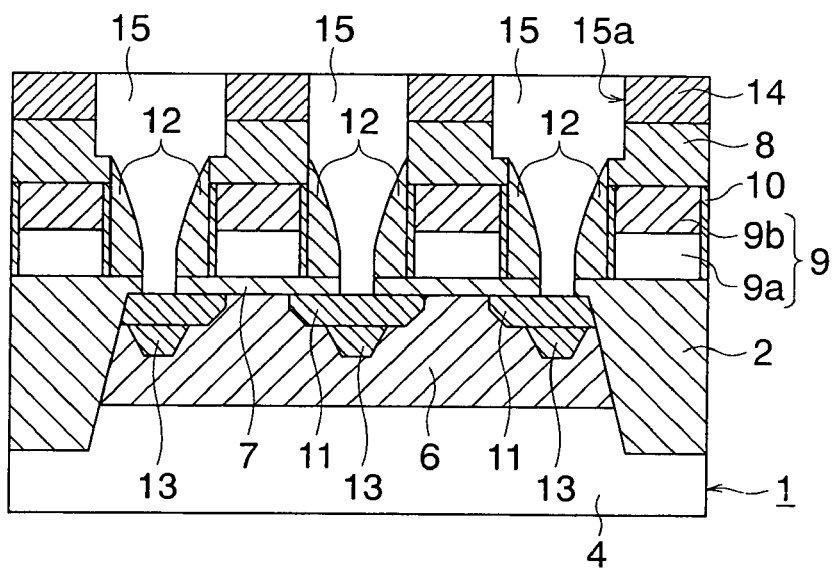

Subsequently, as shown in FIG. 1F, a silicon oxide film and a silicon nitride film are consecutively deposited on the entire surface, thereby forming a 350-nm-thick interlayer dielectric film 14. The interlayer dielectric film 14 is then etched-back using an anisotropic etching technique for planarization thereof. A patterning process is then performed to the interlayer dielectric film 14, a top portion of insulation films 8, a portion of side spacers 12 and a portion of the gate insulation film 7 underlying the side spacers 12, to form through-holes 15a for exposing therethrough surface portions of the source/drain diffused regions 11.

Implantation of phosphorous ions is again performed by a self-aligned technique using the interlayer dielectric film 14, insulation films 8 and side spacers 12 as a mask, toward the bottom of the electric-field alleviating regions 13 through the source/drain diffused regions 11. A polysilicon film doped with phosphorous ions at a concentration of $2\times10^{20}/cm^3$ is then deposited on the interlayer dielectric film 14 and in the through-holes 15a, and etched-back for planarization thereof to configure 350-nm-long contact plugs 15. It should be noted that arsenic may be implanted to the electric-field alleviating regions for reducing the contact resistance between the same and the contact plug 15, before or after the phosphor implantation to the bottoms of electric-field alleviating regions.

Figure 1G:
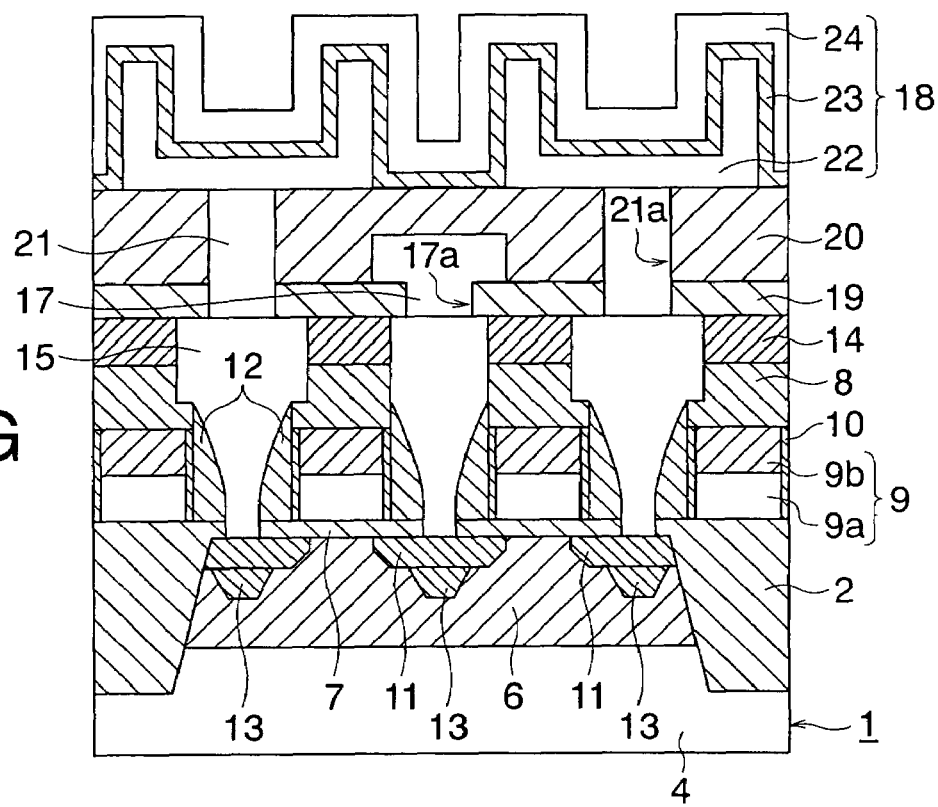

Subsequently, a 50-nm-thick interlayer dielectric film 19 made of silicon oxide is deposited and patterned to form through-holes 17a therein. A 100-nm-thick tungsten film is then deposited on the interlayer dielectric film 19 and in the through-holes 17a, and patterned to configure bit lines 17. Thereafter, an interlayer dielectric film 20 is deposited, followed by patterning the interlayer dielectric films 19 and 20 to form through-holes 21a therein and filling the through-holes 21a with contact plugs 21. Cell capacitors 18 each having a cylindrical structure and including a bottom electrode 22, an insulation film 23 and a top electrode 24 are then formed, the bottom electrode 22 being in contact with the underlying contact plug 21, as shown in FIG. 1G.

As described above in the process of the present embodiment, the implanted fluorine ions each having a high coupling energy terminate the dangling bonds at the vacancy type defects, thereby extinguishing the origins of the junction leakage current. The extinguishment of the origins of the junction leakage current reduces the junction leakage current, to thereby improve the data storage capability of memory cells in the DRAM device.

Although the fluorine implantation is performed after the phosphor implantation and the subsequent heat treatment for forming the source/drain regions in the above embodiment, the fluorine implantation may be performed at any time so long as the fluorine implantation is performed after formation of the vacancy type defects, which are formed by the phosphor implantation and the subsequent heat treatment. The diffusion of the implanted fluorine may be achieved by using any heat treatments conducted for other purposes after the fluorine implantation.

A modification from the above embodiment is such that the fluorine implantation is performed after the step of forming the electric-field alleviating regions 13 in FIG. 1E. The fluorine implantation in the modification may be performed at an acceleration energy of 10 keV and a dosage of $1\times10^{13}/cm^2$. The heat treatment for diffusing the implanted fluorine and the other dopants in the source/drain regions of the peripheral area may be conducted at a substrate temperature of 950 degrees C. for 30 seconds.

Figure 4:
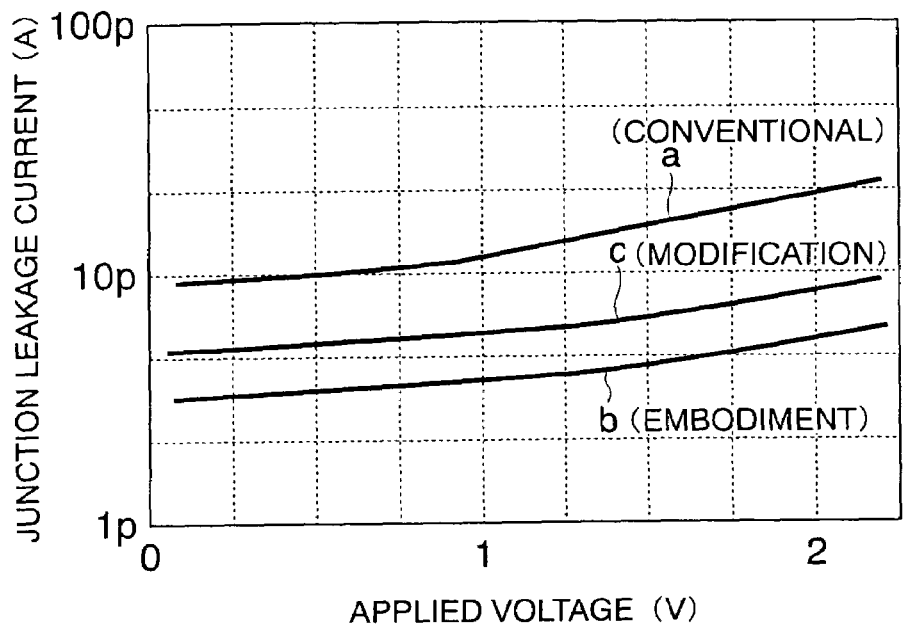
FIG. 4 is a graph showing the relationship between the junction leakage current and the applied voltage in DRAM devices.

FIG. 4 shows the relationship between the junction leakage current and the applied voltage in DRAM devices manufactured by the conventional process, the processes of the embodiment and the modification. The junction leakage current shown is the total of the leakage current for 10 k-bit memory cells. The applied voltage is supplied from the bit lines 17 at a substrate temperature of 85 degrees C., with the substrate voltage, i.e., the voltage applied to the p-well 4 including the p-type channel region 6, being fixed at −1 volt. The curves (a) to (c) represent the results of measurements for the DRAM devices manufactured by the conventional process, processes of the present embodiment and modification therefrom, respectively.

As understood from FIG. 4, the junction leakage current is reduced to around ¼ by the present embodiment and around ½ by the modification compared to that in the conventional process.

Figure 5:
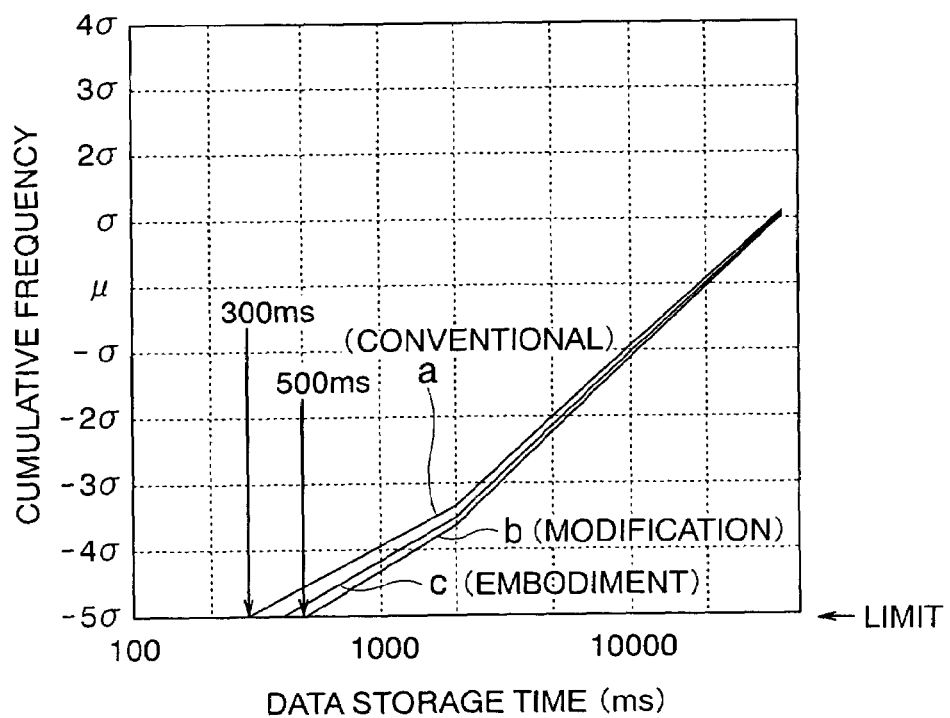
FIG. 5 is a graph showing the relationship between the cumulative frequency and the data storage time in DRAM devices.
Figure 6:
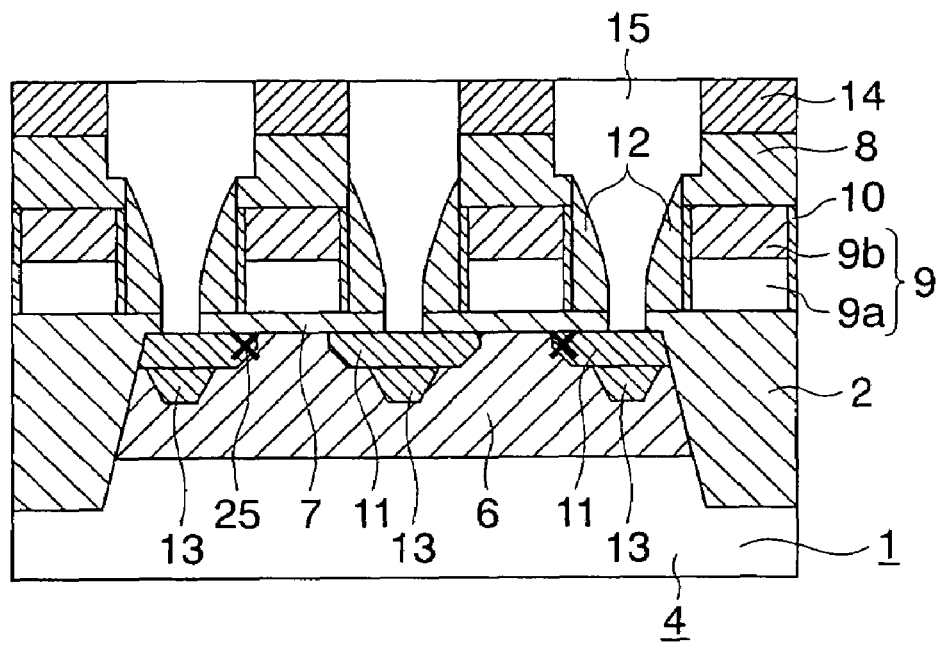
FIG. 6 is a sectional view of a conventional semiconductor device, showing the vacancy type defects left therein.
Figure 7:
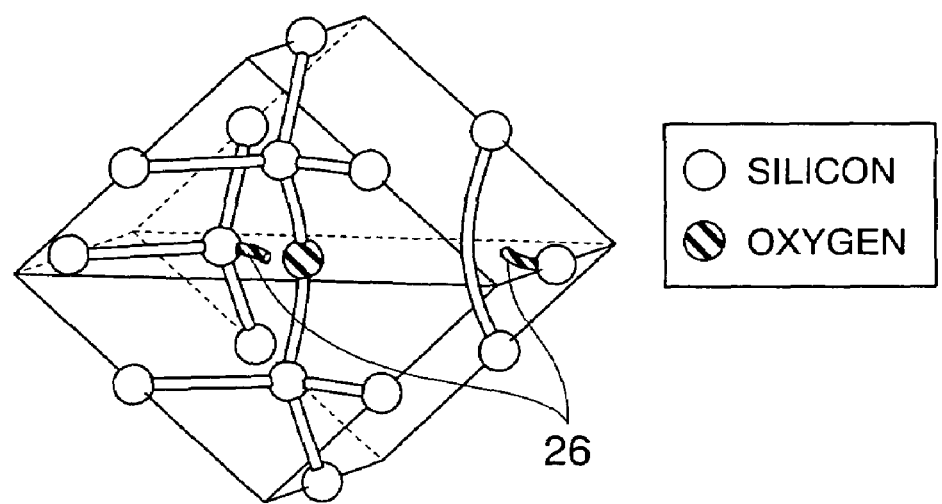
FIG. 7 is a schematic perspective view of the crystal structure of a silicon substrate, showing the vacancy type defects.

FIG. 5 shows the relationship between the cumulative frequency and the data storage time for the DRAM devices same as the DRAM devices for which the relationship is shown in FIG. 4. In FIG. 5, the curves (a) to (c) correspond those in FIG. 4. As understood from FIG. 5, the DRAM devices manufactured by the present embodiment and the modification achieve improvements in the data storage characteristic over the DRAM device manufactured by the conventional process. For example, for a cumulative frequency of −5σ, up to which the DRAM cells are salvaged, corresponds to a data storage time of 300 ms for the conventional process, and corresponds to 500 ms and 400 ms for the present embodiment and the modification, exhibiting the improvements of the latter two cases over the former.

Although fluorine is used for terminating the dangling bonds at the vacancy type defects of the silicon crystal in the above embodiment and the modification, other halogen elements may be used for this purpose in the present invention. Fluorine is preferable, however, because fluorine has a mass smaller than the masses of the other halogen elements such as chlorine and bromine, and requires a less acceleration energy for the implantation at a specified dosage to thereby incur a less number of vacancy type defects. Besides, since the fluorine atom has a smaller atomic radius, the fluorine atoms have a higher mobility during termination of the dangling bonds. Further, since the fluorine has a higher electro-negativity, the fluorine has a higher coupling energy with the dangling bonds after the termination to thereby achieve a stable coupling.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a semiconductor device comprising:
   implanting phosphorous into a semiconductor substrate at a specified dosage;
   heat treating said implanted phosphorous for diffusion thereof to form source/drain regions;
   implanting a halogen into said source/drain regions at a dosage of not higher than said specified dosage after said heat treating of said implanted phosphorous; and
   heat treating said implanted halogen for diffusion thereof.

2. The method according to claim 1, wherein said specified dosage in between $1\times10^{13}/cm^2$ and $3\times10^{13}/cm^2$.

3. The method according to claim 1, wherein said halogen implanting accelerates said halogen at a specified acceleration energy that introduces said halogen at a depth smaller than a depth of said source/drain regions.

4. The method according to claim 1, wherein said halogen implanting accelerates said halogen at a specified acceleration energy that introduces said halogen at a depth smaller than ½ depth of said source/drain regions.

5. The method according to claim 1, wherein said implanted halogen heat treating is conducted at a temperature of 900 to 1000 degrees Celsius.

6. The method according to claim 1, wherein said halogen comprises fluorine.

7. The method of claim 1, wherein said specified dosage is $7\times10^{12}/cm^2$.

8. The method of claim 7, wherein said implanting of said phosphorous is at an acceleration energy of between 15 keV and 20 keV.

9. The method of claim 1, wherein said heat treating of said implanted phosphorous is conducted at a temperature of 1000 degrees Celsius.

10. The method of claim 9, wherein said heat treating of said implanted phosphorous is conducted for ten seconds.

11. The method of claim 1, wherein said halogen is implanted at a dosage of $7\times10^{12}/cm^2$.

12. The method of claim 1, wherein said halogen is implanted at an acceleration energy of 10 keV.

13. The method of claim 1, wherein said heat treating of said implanted halogen is conducted for ten seconds.

14. A method for manufacturing a semiconductor device comprising:
    implanting phosphorous into a substrate at a specified dosage;
    heat treating the implanted phosphorous to form source/drain regions; and
    implanting a halogen into said source/drain regions at a dosage of not higher than said specified dosage.

15. The method of claim 14, further comprising heat treating said implanted halogen.

16. The method of claim 15, wherein said heat treating of said halogen is at a temperature between 900 to 1,000 degrees Celsius.

17. The method of claim 14, wherein said halogen implanting introduces said halogen at a depth that is less than a depth of one of a source and drain region.

18. The method of claim 14, wherein said halogen implanting introduces said halogen at a depth that is less than a one-half a depth of one of a source and drain region.

19. The method of claim 14, wherein said halogen comprises fluorine.

* * * * *